United States Patent [19]
Hvezda et al.

[11] Patent Number: 4,806,856
[45] Date of Patent: Feb. 21, 1989

[54] ADJUSTABLE QUICK-MOUNT TEST PROBE ASSEMBLY

[75] Inventors: Jaroslav M. Hvezda, Nepean; Richard J. Middlehurst, Kanata, both of Canada

[73] Assignee: Northern Telecom Limited, Montreal, Canada

[21] Appl. No.: 127,312

[22] Filed: Dec. 2, 1987

[51] Int. Cl.$^4$ ............................................... G01R 1/06
[52] U.S. Cl. ................................ 324/158 P; 324/72.5
[58] Field of Search ................. 324/158 P, 158 F, 72.5

[56] References Cited

U.S. PATENT DOCUMENTS

| 2,825,871 | 4/1958 | Evans | 324/158 P |
| 3,345,567 | 10/1967 | Turner et al. | 324/158 P |
| 3,437,929 | 4/1969 | Glenn | 324/158 F |
| 3,590,372 | 6/1971 | De Santis et al. | 324/158 P |

Primary Examiner—Ernest F. Karlsen
Attorney, Agent, or Firm—Robert C. Hogeboom

[57] ABSTRACT

An adjustable quick-mount test probe assembly for use in circuit testing. The test probe assembly provides a convenient means for testing printed circuit boards containing Very Large Scale Integrated (VLSI) components and high density interconnect substrates. This is due to its versatility in terms of positioning and its use of replaceable, "off-the-shelf" test probe tips. The test probe assembly provides a means of quickly connecting test clips from a test equipment unit to a circuit board, as well as providing a means of neatly arranging test leads to avoid the possibility of entanglement and reducing strain on the test probe. Test set-up time is greatly reduced, and confidence of test set-up integrity is increased.

12 Claims, 5 Drawing Sheets

ADJUSTABLE QUICK-MOUNT TEST PROBE ASSEMBLY

FIELD OF THE INVENTION

The invention relates in general to test probe assemblies. More particularly, the invention relates to an adjustable, quick-mount, test probe assembly for use with standard test clips.

BACKGROUND OF THE INVENTION

The increasing use of VSLI components, and high density packing of integrated circuits on printed circuit boards, is making the use of standard test clips increasingly difficult. Although the use of VLSI components is meeting the challenge imposed by the requirements for increased speed and density, a new interface problem has arisen in the ability to perform circuit testing due to the increased density of circuit test points and signal pins. The congestion, or density, factor at the component level is such that many current test probe devices either are not compatible with, or are not sufficiently flexible for present devices. Standard test probes are difficult to connect to the desired test points and if a number of signals are to be tested in conjunction, it is very often difficult to connect all of the required test clips. A resulting problem is the congestion, possible entanglement, misconnection, and shorting of the test leads and the time and complexity of making the connections.

SUMMARY OF THE INVENTION

The present invention provides a solution for both the problems of lead congestion and probe positioning. The present invention is an adjustable quick-mount test probe assembly comprising a replaceable metal tip attached to a probe support. The probe support is provided to allow precise horizontal positioning. Vertical positioning is provided by a probe body which holds the probe support at a variety of possible angles. Once the test probe assembly is in position, a test clip from a test equipment unit is clipped onto a metal hook connected to the test probe tip. A test lead attached to the test clip is held in position by a slot in the top of the test probe assembly, providing a convenient strain relief mechanism. Thus a convenient method of accessing a plurality of circuit board test points is achieved, while maintaining an orderly collection of test leads.

Stated in other terms, the present invention is an adjustable quick-mount test probe assembly comprising: a conductor means for electrically connecting to an electric circuit; a first positioning means, electrically isolated from the conductor means, for horizontally adjusting the conductor means; a second positioning means, electrically isolated from the conductor means, for vertically adjusting the conductor means; a stud for mounting the test probe assembly, the stud having a pin perpendicularly connected thereto, whereby the stud and the pin interact with a cam lock fastener to support the test probe assembly, the stud being part of a holding device for holding the first positioning means; an attachment means for electrically connecting a test clip to the conductor means; and a means for securing a test lead extending from the test clip.

BRIEF DESCRIPTION OF THE DRAWINGS

A preferred embodiment of the invention will now be described by way of example only with reference to the following figures.

DETAILED DESCRIPTION

Figure 1:
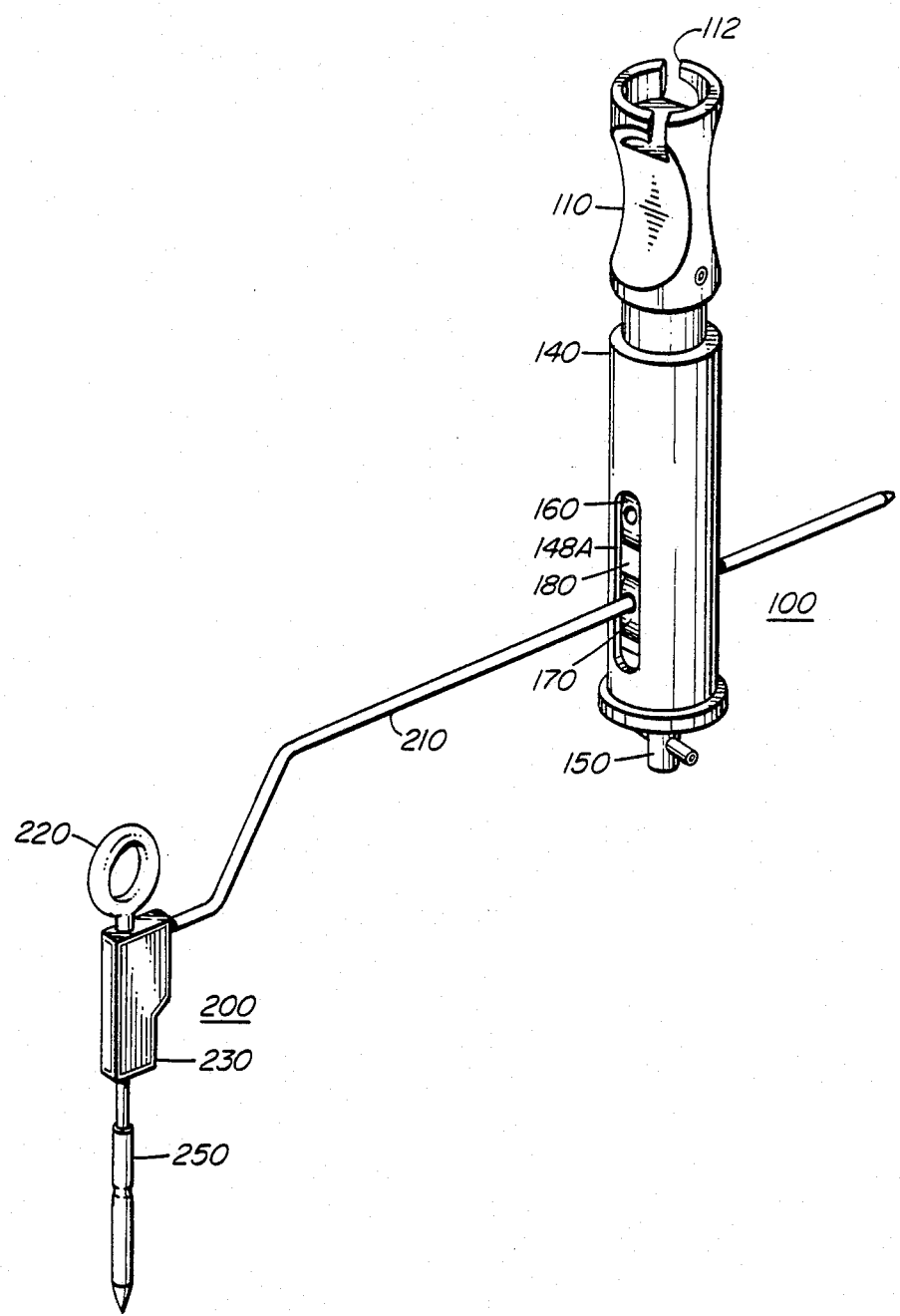
FIG. 1 is a perspective drawing of an adjustable quick-mount test probe assembly of the present invention.

FIG. 1 is an illustration of an adjustable quick-mount test probe assembly 100. Test probe assembly 100 comprises a push button 110; a sleeve 140; a holding device assembly 150; and a probe support 200. Test probe positioning is provided by probe support 200 (horizontal positioning) and holding device 150 (vertical positioning). Any number of positions may be accessed with such an assembly by the manual manipulation of assembly 100 by a human operator.

Figure 2:
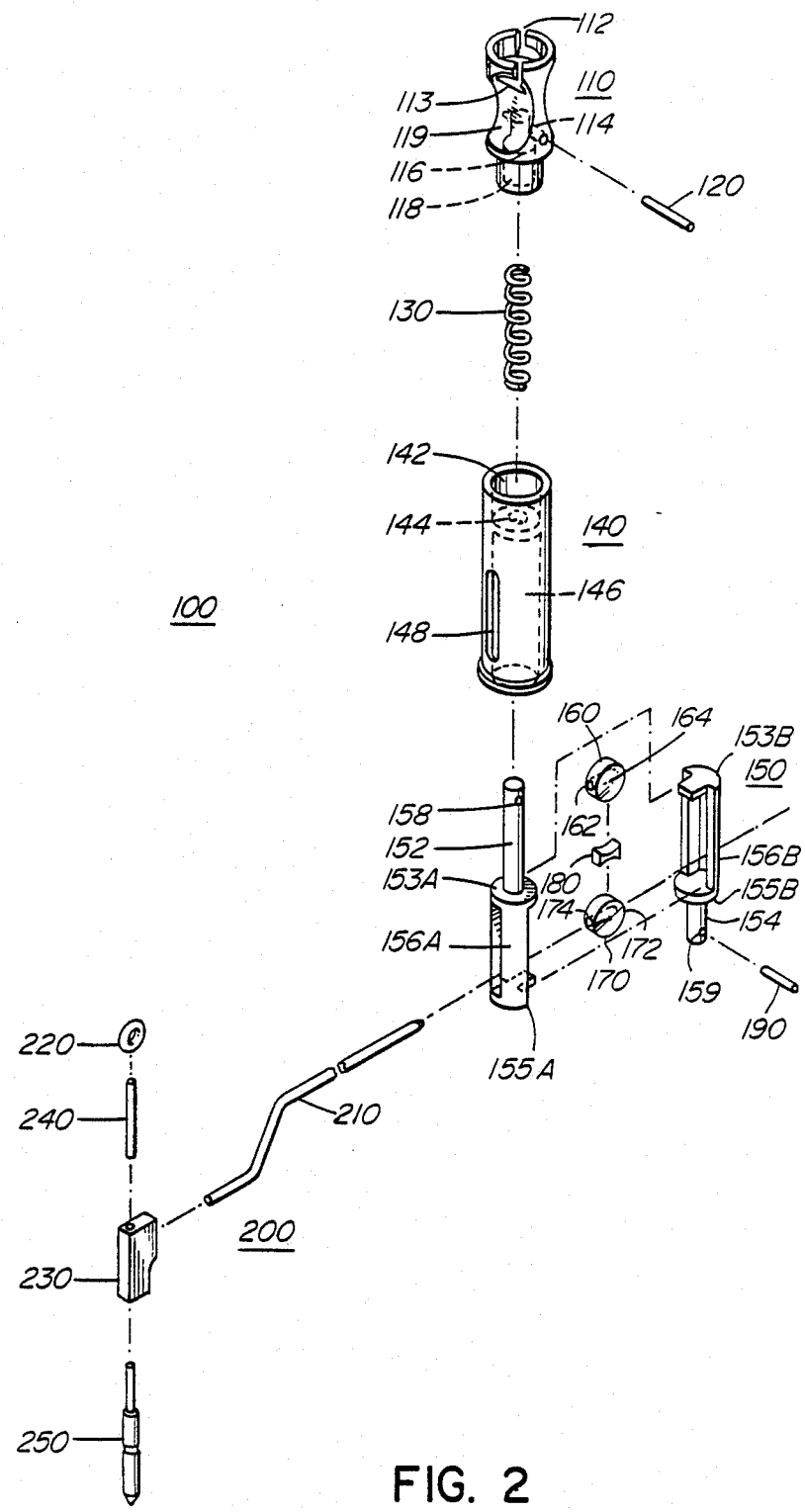
FIG. 2 is an exploded side view of the test probe assembly of FIG. 1.

FIG. 2 is an exploded view of quick-mount test probe assembly 100. Probe support 200 comprises a replaceable, "off-the-shelf" metal probe tip 250 (such as Factrons SMT probe, part #733414) which is used to provide an electrical connection to the circuit board or component under test. Probe tip 250 is spring loaded to provide correction for minor vertical positioning errors. Probe tip 250 is pressure fitted to metal probe receptacle 240 (such as Factrons SMT receptacle, part #733416) which, in turn, is form fitted to plastic housing 230. Connected to the other end of probe receptacle 240 is a metal ring 220 which is used to allow test clip 1000 (FIG. 10) to be clipped, and electrically connected, to probe receptacle 240 and thereby to probe tip 250. Housing 230 is connected to arm 210 by an adhesive, such as epoxy, and arm 210 is therefore electrically isolated from probe receptacle 240. Probe support 200 is held in position by holding device assembly 150.

Figure 3:
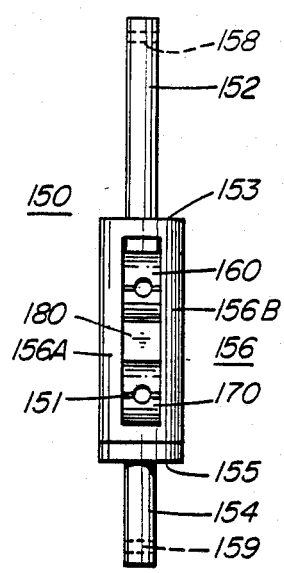
FIG. 3 is a side view of a portion of the test probe assembly of FIG. 2.
Figure 4:
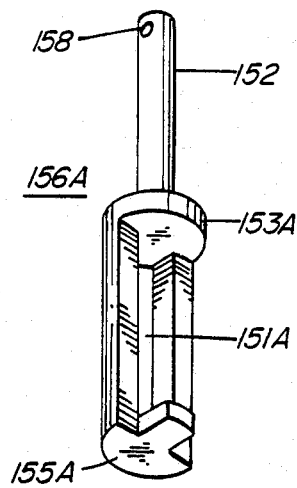
FIG. 4 is a perspective view of the upper body of the assembly of FIG. 3.
Figure 5:
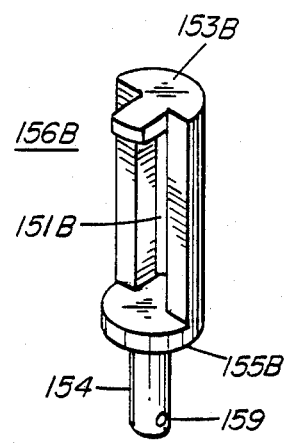
FIG. 5 is a perspective view of the lower body of the assembly of FIG. 3.
Figure 6:
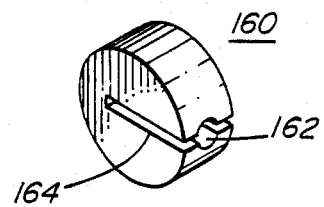
FIG. 6 is a perspective view of a brake shoe.
Figure 7:
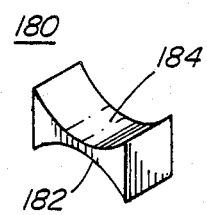
FIG. 7 is a perspective view of a disk.

Holding device assembly 150 (shown in exploded view in FIG. 2, and assembled in FIG. 3) comprises holding device body 156 (having a base 155 and a top 153), divided into two halves 156A and 156B (having base 155A and 155B respectively and top 153A and 153B respectively, shown in more detail in FIGS. 4 and 5); a metal brake shoe 180 (shown in more detail in FIG. 6); and two identical plastic disks 160 (shown in more detail in FIG. 7) and 170. Disk 160 has a hole 162 drilled longitudinally through the center of it to accept probe support 200. A compression slot 164, running radially to the face of disk 160 and extending approximately for ¾ of the diameter of disk 160, is provided to assert a gripping force on probe support 200 (described in more detail below). Disk 170 is constructed in a similar fashion (one may realize the description of disk 160). Metal brake shoe 180 is constructed in such a manner as to have opposing concavities (182 and 184) substantially complimentary to the peripheral surfaces of the disks 160 and 170.

The above-mentioned gripping force is asserted by a co-working of parts 156, 160, 170, and 180. When holding device body pats 156A and 156B are pulled in opposite directions, disk 160 is compressed between holding device body 156B and brake shoe 180. Similarly, disk 170 is compressed between holding device body 156A and brake shoe 180. The compression of disks 160 and 170 cause compression slots 164 and 174 to narrow, thus providing a frictional, or gripping, force on probe support 200 if positioned in hole 162 or 172.

Holding device body parts 156A and 156B are pulled apart by the interaction of spring 130, assembly pin 120 and holding pin 190. When test probe assembly 100 is mounted in a suitable receptacle (600 in FIGS. 8 and 9), holding pin 190, supported by hole 159 in holding device arm 154, will maintain holding device arm 154 and thus holding device body 156B in a fixed position. Spring 130 is positioned in a hollow 142 of sleeve 140 and a hollow 118 of push button 110. Spring 130 thus provides a force pushing sleeve 140 and push button 110 apart. As holding device assembly 150 is attached to push button 110 by assembly pin 120 (passed through channel 114 in push button 110) and hole 158 in holding device arm 152), holding device arm 152, and hence holding device body 156A, is pulled upwards by spring 130 pushing on push button 110. Thus, in the resting (engaged) position, disks 160 and 170 are compressed. To release (disengage) probe support 200, push button 110 is pushed towards sleeve 140, thus compressing spring 130. As holding device assembly 150 is attached to push button 110 by assembly pin 120, holding device body 156A is also pushed downwards (in the Figure) thus releasing the compression force on disks 160 and 170.

Horizontal positioning of probe support 200 is accomplished by pressing push button 110 (with normal human force) to release the compression force on disks 160 and 170. Arm 210 is then slid (using normal human force) in or out of hole 162 or 172 (depending on which disk was originally chosen for positioning). Arm 210 is subsequently held in place by releasing push button 110, thus re-applying the compressive force on disks 160 and 170.

Vertical positioning of probe support 200 is accomplished by two means. The first means is the use of either disk 160 or 170 for support of probe support 200 as the disks are assembled such that one is above the other. The second means makes use of the fact that disks 160 and 170 are circular. By rotating the appropriate disk 160 or 170, the vertical positioning of probe support 200 may be altered up or down. The vertical position is maintained by the frictional force applied by brake shoe 180 and holding device body 156 against disks 160 and 170. The vertical position may be altered by depressing push button 110, which in turn will release the forces applied to disks 160 and 170 allowing probe support 200 to be moved.

Figure 8:
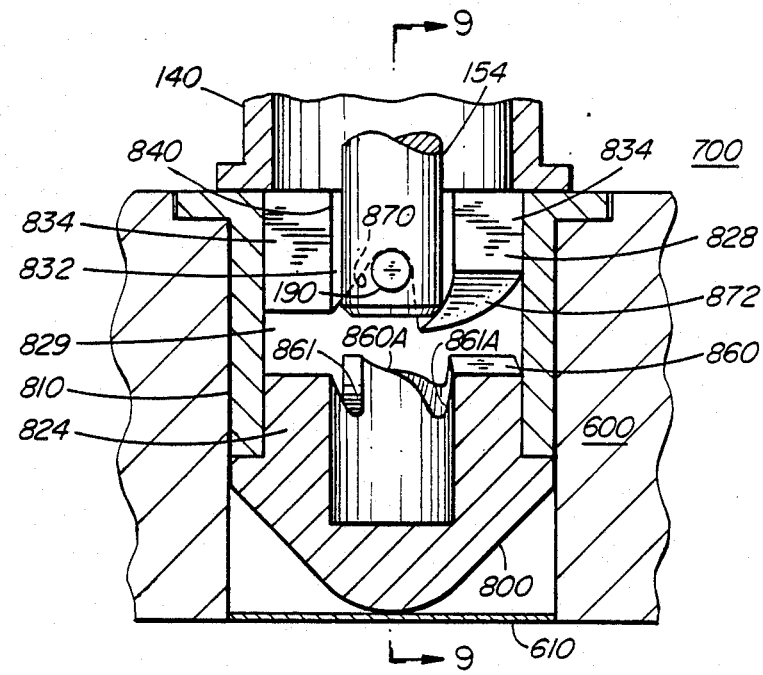
FIG. 8 is a side cross-sectional view of a cam assembly, also depicted in FIG. 9, taken along section lines 8—8.
Figure 9:
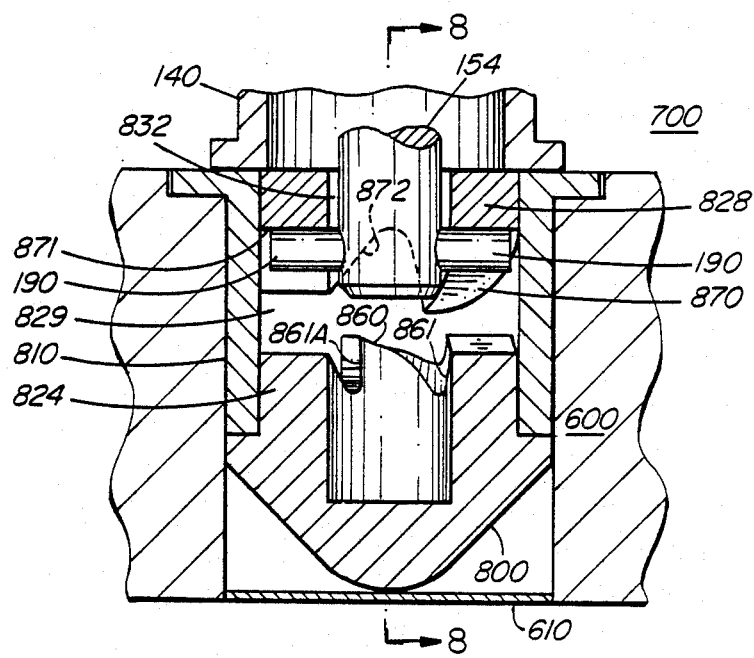
FIG. 9 is a further side cross-sectional view of the cam assembly depicted in FIG. 8 taken along section lines 9—9.

Holding device assembly 150 also serves as a mounting means for test probe assembly 100. FIGS. 8 and 9 show a more detailed side cross-sectional view of a cam assembly 800 which is used to fasten test probe assembly 100 to a support member 600. The cam assembly 800 used is that of U.S. Pat. No. 3,152,822, dated Oct. 13, 1964 in the name of E. G. Griffiths entitled "Push Button Fastener". The Figures are shown here for ease of description of a particular embodiment of the present invention. As soon as holding device arm 154 has been inserted into central opening 832 (shown in FIG. 8) of cam assembly 800 contained in support member 600, locking pin 190 is automatically aligned with slot 834 in circular detent cam 828. Holding device arm 154 and locking pin 190, are further inserted into central opening 832 by pressing on push button 110, compressing spring 130, thus placing locking pin 190 in passageway 829. Locking pin 190 acts as the cam follower which tracks the surface contours of cams 828 and circular indexing cam 824. As locking pin 190 enters passageway 829 it first strikes inclined surface 860 on indexing cam 824 which then turns in a circular path until locking pin 190 stops its motion by coming in contact with detent 861. Push button 110 is then released, allowing spring 130 to return to its rest position. As spring 130 begins its return, holding device arm 154 and locking pin 190 move in an upwards direction. Locking pin 190 strikes inclined surface 870 on detent cam 828, under which surface locking pin 190 has become aligned. Inclined surface 870 acting against locking pin 190 causes cam 828 to rotate, continuing in the same direction as initiated by inclined section 860, until locking pin 190 comes in contact with detent 871. The fastener is now locked in position.

To unlock the fastener the push button 110 is again pressed, thus moving locking pin 190 out of its locked position causing it to strike inclined surface 860A on cam 824 which causes cam 824 to rotate in the same direction as before until locking pin 190 comes in contact with detent 861A. At this point push button 110 is released causing spring 130 to return to its rest position and thus moving holding device arm 154 and locking pin 190 in an upwards direction. Locking pin 190 then comes in contact with inclined surface 872 on detect cam 828 which will rotate aligning locking pin 190 with slot 834. At this point holding device arm 154 may be removed from fastener 700.

Figure 10:
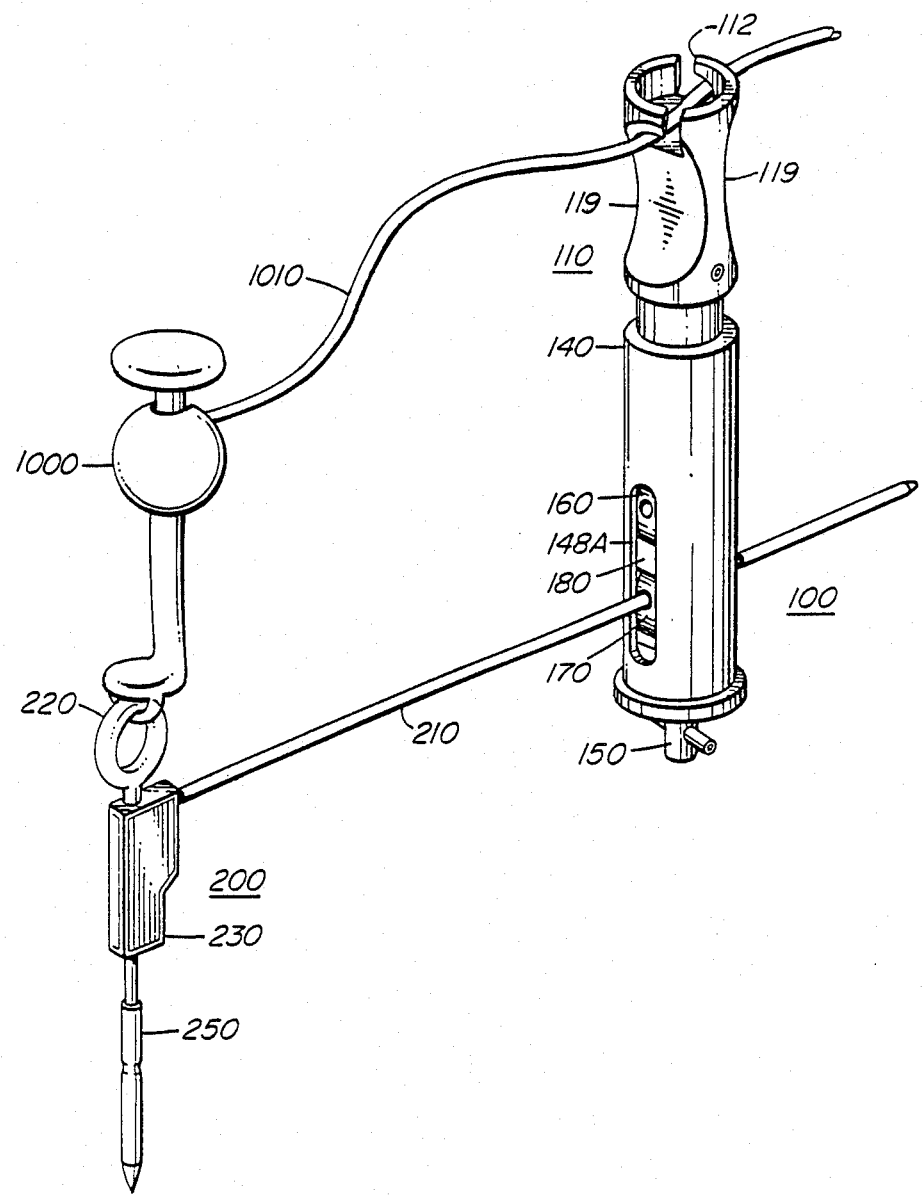
FIG. 10 is a perspective drawing of an adjustable quick-mount test probe assembly showing the method of interconnection with a test clip.

FIG. 10 is an illustration of an adjustable quick-mount test probe assembly 100. Test clip 1000 is clipped to probe support 200 to provide an electrical connection to the circuit or component (not shown) under test. Push button 110 has within it a slot 112 which can be used to hold a test lead 1010 coming from test clip 1000 and attached to the test equipment. Thus test leads can be neatly arranged to avoid entanglement. Push button 110 also has two concavities 119 opposite each other which act as a convenient finger hold for ease of operation.

It may be noted that it is possible to use two probe arms 210, one being placed in disk 160, the other in disk 170. By applying this technique the number of quick-mount test probe assemblies required may be reduced.

It can be seen from the above description that the present invention provides a convenient, reliable method of test equipment probe alignment while providing a means for neatly arranging test leads. It can also be noted that the test probe assembly may be quickly mounted to, and removed from, a support member. Test set up time can be reduced, and confidence of test point connections increased.

Other uses of the present invention may include testing of any type of electrical circuit, for example backplanes, or television circuitry.

What is claimed is:

1. An adjustable quick-mount test probe assembly comprising:
   a conductor means for electrically connecting to an electric circuit;
   a first positioning means, electrically isolated from said conductor means, for horizontally adjusting said conductor means;
   a second positioning means, electrically isolated from said conductor means, for vertically adjusting said conductor means;
   a stud for mounting said test probe assembly, said stud having a pin perpendicularly connected thereto, whereby said stud and said pin interact with a cam lock fastener to support said test probe assembly, said stud being part of a holding device for holding said first positioning means;
   an attachment means for electrically connecting a test clip to said conductor means; and
   a means for securing a test lead extending from said test clip.

2. The adjustable quick-mount test probe assembly as claimed in claim 1 wherein said conductor means is a replaceable metal probe tip connected to a metal receptacle.

3. The adjustable quick-mount test probe assembly as claimed in claim 2 wherein said second positioning means is said holding device.

4. The adjustable quick-mount test probe assembly as claimed in claim 3 wherein said holding device comprises:
   a plurality of disks having means for supporting said first positioning means and providing said second positioning means;
   at least one brake shoe having opposing concavities substantially complimentary to the peripheral surfaces of said disks; and
   a body having an opening for holding said disks and said brake shoes such that they are in contact with each other, said body being of two halves, a first half and a second half, such that when the two halves are moved in opposite directions along the same plane, said disks and said brake shoes are compressed together.

5. The adjustable quick-mount test probe assembly as claimed in claim 4 wherein said holding device is covered by a sleeve having a channel, substantially narrower than said opening, whereby said sleeve holds said disks and said brake shoes in place as well as allowing access to said disks.

6. The adjustable quick-mount test probe assembly as claimed in claim 7 wherein said holding device is operated by a spring loaded push button.

7. The adjustable quick-mount test probe assembly as claimed in claim 6 wherein said means for supporting said test lead is a slot in said push button.

8. The adjustable quick-mount test probe assembly as claimed in claim 7 wherein said means for electrically connecting a test clip to said means for electrical connection is a metal ring connected to said metal receptacle.

9. The adjustable quick-mount test probe assembly as claimed in claim 8 wherein said plurality of disks is two and said at least one brake shoe is one.

10. The adjustable quick-mount test probe assembly as claimed in claim 9 wherein said body is cylindrical and said opening is rectangular.

11. The adjustable quick-mount test probe assembly as claimed in claim 10 wherein said channel is elliptical.

12. An adjustable quick-mount test probe assembly (100) comprising:
   a metal ring (220) attached to a metal receptacle (240);
   a housing (230) for securing said metal receptacle (240);
   a replaceable spring loaded metal probe tip (250) which snaps onto said metal receptacle (240);
   an arm (210) to which said housing (230) is attached by an adhesive;
   a holding device (150) comprised of:
     a first circular disk (160) having a circular hole (162) extending through the disk (160) in a direction parallel to the plane of the disk's planar sides for accepting said arm (210) and a slot (164) extending substantially through the disk (160) perpendicular to the plane of the disk's planar sides;
     a second circular disk (170) having a circular hole (172) extending through the disk (170) in a direction parallel to the plane of the disk's planar sides for accepting said arm (210) and a slot (174) extending substantially through the disk (170) perpendicular disk's planar sides;
     a brake shoe (180) intermediate said first and second disks (160 and 170) for mating with said first and second disks (160 and 170) and aiding to apply pressure to said first and second disks (160 and 170) to compress said slots (164 and 174) so as to create a frictional force upon said arm (210) to substantially hold it in position, said brake shoe (180) having two concave surfaces opposite each other substantially complementary to the peripheral surfaces of said disks (160 and 170); first sides having two flat surfaces parallel to each other and perpendicular to said concave surfaces; and second sides having two flat surfaces parallel each other and mutually perpendicular to said first sides and concave surfaces;
     a cylindrical metal body (156A, 156B) for containing said first and second disks (160 and 170) and said brake shoe (180), having a rectangular channel (151) to allow access to said holes (162 and 172) in said first and second disks (160 and 170);
     said cylindrical metal body (156) comprising two separate halves (156A and 156B) which when pulled in opposite directions will aid in compressing said slots (164 and 174);
     said cylindrical metal body (156) having a first cylindrical arm (154) extending from said cylindrical metal body's base (155) with a circular hole (159) passing through said first cylindrical arm (154) at a point distal to said base (155) to accept a first pin (190); and
     said cylindrical metal body (156) having a second cylindrical arm (152) extending from said cylindrical metal body's top (153) with a circular hole (158) passing through said second cylindrical arm (152) at a point distal to said top (153) to accept a second pin (120);
   a cylindrical sleeve (140) comprised of:
     a channel (148A) to allow access to said disks (160 and 170);

a second channel (14BB) opposite said first channel (148A) to allow access to said disks (160 and 170):

a first circular hollow (146) to at least accept said holding device (150);

a second circular hollow (144) to at least accept said holding device arm (152); and a third circular hollow (142) to at least accept a push button (110);

a helical spring (130); and a circular push button (110) having concave surfaces (119) opposite each other on the longitudinal axis comprising of:

a slot (112) at least large enough to accept a test lead (1010);

an opening (113) to retain said test lead (1010);

a hole (114) extending through said push button distal to said slotted top (112) and perpendicular to the plane of operation of said push button to accept said second pin (120);

a circular hollow (116) to at least accept said second cylindrical arm (152); and a circular hollow (118) to at least accept said helical spring (130).

* * * * *